United States Patent
Ramdani

(10) Patent No.: US 8,624,260 B2
(45) Date of Patent: Jan. 7, 2014

(54) ENHANCEMENT-MODE GAN MOSFET WITH LOW LEAKAGE CURRENT AND IMPROVED RELIABILITY

(75) Inventor: Jamal Ramdani, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 102 days.

(21) Appl. No.: 12/697,235

(22) Filed: Jan. 30, 2010

(65) Prior Publication Data

US 2011/0186855 A1   Aug. 4, 2011

(51) Int. Cl.
*H01L 29/15* (2006.01)
(52) U.S. Cl.
USPC .................. 257/76; 257/E33.04; 257/E21.403
(58) Field of Classification Search
USPC ................................ 257/E21.403, 76, E33.04
See application file for complete search history.

(56) References Cited

U.S. PATENT DOCUMENTS

| | | |
|---|---|---|
| 2002/0119610 A1 | 8/2002 | Nishii et al. |
| 2003/0020092 A1 | 1/2003 | Parikh et al. |
| 2004/0004247 A1* | 1/2004 | Forbes et al. ................. 257/324 |
| 2006/0019435 A1* | 1/2006 | Sheppard et al. ............. 438/167 |
| 2007/0018199 A1* | 1/2007 | Sheppard et al. ............. 257/200 |
| 2007/0145390 A1* | 6/2007 | Kuraguchi ....................... 257/94 |
| 2009/0191674 A1 | 7/2009 | Germain et al. |
| 2010/0012977 A1 | 1/2010 | Derluyn et al. |
| 2010/0025730 A1* | 2/2010 | Heikman et al. .............. 257/194 |

FOREIGN PATENT DOCUMENTS

WO   WO2007041595 A2   4/2007

OTHER PUBLICATIONS

Maeda et al. (Systematic Study of Insulator Deposition Effect (Si3N4, SiO2, AlN, and Al2O3) on Electrical Properties in AlGaN/GaN Heterostructures), 2007, Japanese Journal of Applied Physics, vol. 46, No. 2, pp. 547-554.*

F. Ren et al., "Effect of temperature on Ga2O3 (Gd2O3)/GaN metal-oxide-semiconductor field-effect transistors", Applied Physics Letters, vol. 73, No. 26, Dec. 28, 1998, pp. 3893-3895.

Y.C. Chang et al., "Structural and electrical characteristics of atomic layer deposited high k HfO2 on GaN", Applied Physics Letters 90, 232904, 2007, pp. 232904-1-232904-3.

Hiroshi Kambayashi et al., "Enhancement-mode GaN Hybrid MOSHFETs on Si substrates with Over 70 A operation", Power Semiconductor Devices & IC's, 2009, ISPSD 2009. 21st International Symposium on, Jun. 14-18, 2009, pp. 21-24.

Y.C. Chang et al., "Inversion-channel GaN metal-oxide-semiconductor field-effect transistor with atomic-layer-deposited Al2O3 as gate dielectric", Applied Physics Letters 93, 053504, 2008, pp. 053504-1-053504-3.

Ki-Sik Im et al., "Normally-off GaN MOSFET Based on AlGaN/GaN Heterostructure with Extremely High 2DEG Density Grown on Silicon Substrate", IEEE Electron Device Letters, vol. 31, Issue 3, Mar. 2010, pp. 192-194 (pp. 1-3 of copy submitted).

(Continued)

*Primary Examiner* — Julio J Maldonado
*Assistant Examiner* — Hajar Kolahdouzan
(74) *Attorney, Agent, or Firm* — Alan A. R. Cooper; W. James Brady, III; Frederick J. Telecky, Jr.

(57) ABSTRACT

An enhancement-mode GaN MOSFET with a low leakage current and an improved reliability is formed by utilizing a $SiO_2/Si_3N_4$ gate insulation layer on an AlGaN (or InAlGaN) barrier layer. The $Si_3N_4$ portion of the $SiO_2/Si_3N_4$ gate insulation layer significantly reduces the formation of interface states at the junction between the gate insulation layer and the barrier layer, while the $SiO_2$ portion of the $SiO_2/Si_3N_4$ gate insulation layer significantly reduces the leakage current.

20 Claims, 4 Drawing Sheets

(56) References Cited

OTHER PUBLICATIONS

M.J. Wang et al., "Tunneling induced electron transfer in SiNx/AlGaN/GaN based metal-insulator-semiconductor structures", Physics Letters A 371, 2007, pp. 249-253.

C.Y. Chang et al., "Development of enhancement mode AlN/GaN high electron mobility transistors", Applied Physics Letters 94, 263505, 2009, pp. 263505-1-263505-3.

W.H. Chang et al., "High k dielectric single-crystal monoclinic Gd2O3 on GaN with excellent thermal, structural, and electrical properties", Journal of Crystal Growth 311, 2009, pp. 2183-2186.

U.S. Appl. No. 12/657,757, filed Jan. 27, 2010 to Jamal Ramdani.

PCT International Search Report for PCT/US2011/020916.

PCT Written Opinion of the International Searching Authority for PCT/US2011/020916.

M.P.E.P. Cover Page—700, Rev. 25, Jul. 1970, pp. 61.

M.P.E.P. Rev. 18, Oct. 1968, pp. 68.

In re Walter M. Fuller, 35 F.2d 62 (US Court Customs and Patent Appeals, 1929).

\* cited by examiner

ENHANCEMENT-MODE GAN MOSFET WITH LOW LEAKAGE CURRENT AND IMPROVED RELIABILITY

BACKGROUND OF THE INVENTION

1. Field of the Invention

The present invention relates to GaN MOSFETs and, more particularly, to an enhancement-mode MOSFET with low leakage current and improved reliability.

2. Description of the Related Art

GaN MOSFETS are well known in the art, and are of utilized in high power, high frequency, and high temperature applications. GaN MOSFETS are typically based on the formation of a heterojunction between a GaN region, typically known as the channel layer, and an overlying AlGaN region, typically known as a barrier layer. The GaN channel layer and the AlGaN barrier layer have different band gaps that induce the formation of a two-dimensional electron gas (2DEG) that lies at the junction between the GaN channel layer and the AlGaN barrier layer and extends down into the GaN channel layer.

The 2DEG, which functions as the "channel" of the transistor, produces a high concentration of electrons which causes a conventionally-formed GaN MOSFET to function as a depletion-mode device (nominally on when zero volts are applied to the gate of the device, and the source and drain regions of the device are differently biased).

Although there are applications for depletion-mode GaN MOSFETs, the nominally on state of a depletion-mode transistor requires the use of a control circuit during start up to ensure that source-to-drain conduction within the transistor does not begin prematurely. On the other hand, an enhancement-mode GaN MOSFET (nominally off when zero volts are applied to the gate of the device, and the source and drain regions of the device are differently biased) does not require a control circuit because the transistor is nominally off at start up when zero volts are placed on the gate.

However, to form an enhancement-mode GaN MOSFET, the AlGaN barrier layer must be made thin enough (e.g., a few nm thick) so that when zero volts are applied to the gate of the device, (and the source and drain regions of the device are differently biased) substantially no electrons are present in the 2DEG region, and when a voltage that exceeds a threshold voltage is applied to the gate of the device, (and the source and drain regions of the device are differently biased), electrons accumulate in the 2DEG region and flow from the source region to the drain region.

One problem with reducing the thickness of the AlGaN barrier layer is that high levels of leakage current can pass through the AlGaN barrier layer to the gate, which is conventionally implemented as a Schottky contact. One solution to this problem is to add a gate insulation layer that lies between the AlGaN barrier layer and the gate.

Current-generation, enhancement-mode GaN MOSFETs use a variety of deposited oxides to form the gate insulation layer. These deposited oxides include $Al_2O_3$, $HfO_2$, MgO, $Gd_2O_3$, $Ga_2O_3$, $ScO_2$, and $SiO_2$. Of all of these oxides, $SiO_2$ has a bandgap Eg of 9 eV and a ΔEc to AlGaN that can be as high as 2.5 eV, thereby leading to the lowest leakage current and a threshold voltage as high as 2.5 volts.

One problem with all of these deposited oxides, including $SiO_2$, is that these deposited oxides have a high density of interface states (e.g., greater than $4 \times 10^{11}/cm^2$) that results in a large number of trapping sites at the junction between the gate insulation layer and the AlGaN barrier layer. Large numbers of trapping sites lead to the breakdown of the gate insulation layer which, in turn, reduces the long-term reliability of the GaN devices. Thus, there is a need for an enhancement-mode GaN MOSFET that has a low leakage current.

DETAILED DESCRIPTION OF THE INVENTION

FIGS. 1-4 show a series of cross-sectional views that illustrate an example of a method of forming an enhancement-mode GaN MOSFET 100 in accordance with the present invention. As described in greater detail below, the method of the present invention forms a $SiO_2/Si_3N_4$ gate insulation layer on an AlGaN barrier layer (or optional InAlGaN barrier layer) which significantly reduces the formation of interface states at the junction between the gate insulation layer and the barrier layer. Reducing the density of interface states significantly reduces the number of trapping sites which, in turn, improves the long-term reliability on the GaN devices.

Figure 1:
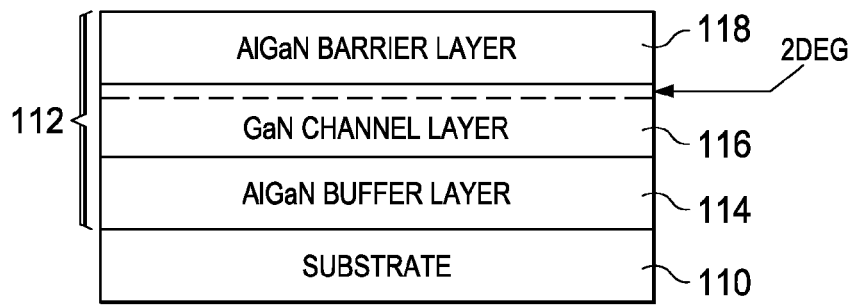
FIGS. 1-4 are a series of cross-sectional views illustrating an example of a method of forming an enhancement-mode GaN MOSFET 100 in accordance with the present invention.

As shown in FIG. 1, the method of the present invention utilizes a conventionally-formed semiconductor substrate 110. Substrate 110 can be implemented as an insulating substrate or with a highly resistive material such as silicon (e.g., <111>), sapphire, or silicon carbide. As further shown in FIG. 1, the method of the present invention begins by forming an epitaxial layer 112 on substrate 110. Epitaxial layer 112, which is formed in a metal organic chemical vapor deposition (MOCVD) reactor using a conventional process, includes an undoped AlGaN buffer layer 114, an undoped GaN channel layer 116, and an undoped or n-doped AlGaN barrier layer 118 (or optionally an undoped or n-doped InAlGaN barrier layer 118). The AlGaN buffer layer 114, in turn, includes a number of undoped AlGaN layers with different aluminum compositions that are used to mitigate stress.

Figure 2:
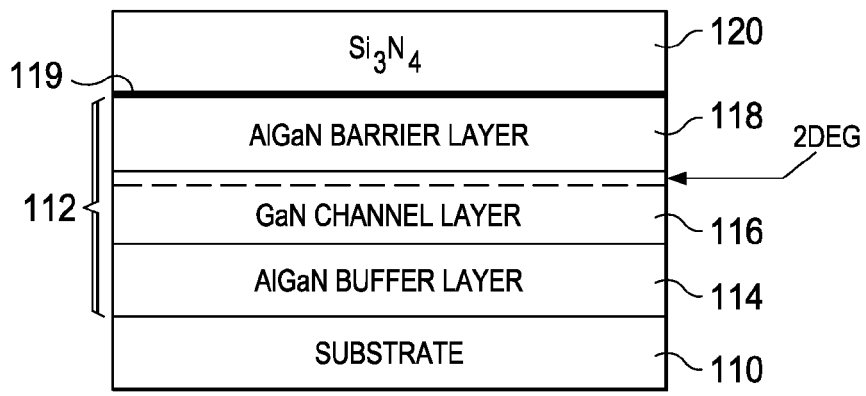

As shown in FIG. 2, in accordance with the present invention, after epitaxial layer 112 has been formed, a $Si_3N_4$ layer 120 is epitaxially grown on the AlGaN barrier layer 118 directly in the same MOCVD reactor as the AlGaN barrier layer 118 using $SiH_4$ and $NH_3$. In other words, the $Si_3N_4$ layer 120 is epitaxially grown after the AlGaN layer 118 is grown without removing the structure with the AlGaN layer 118 from the MOCVD reactor.

The $Si_3N_4$ layer 120 is preferably grown to have a thickness of approximately 10-100 nm, with the specific thickness being application dependent. SiN and AlGaN share the same anion, and as a result, produce a lower transition layer 119 between the Si3N4 layer 120 and the AlGaN barrier layer 118 that has a very low density of interfacial states, e.g., expected to be less than $1 \times 10^{11}/cm^2$.

Figure 3:
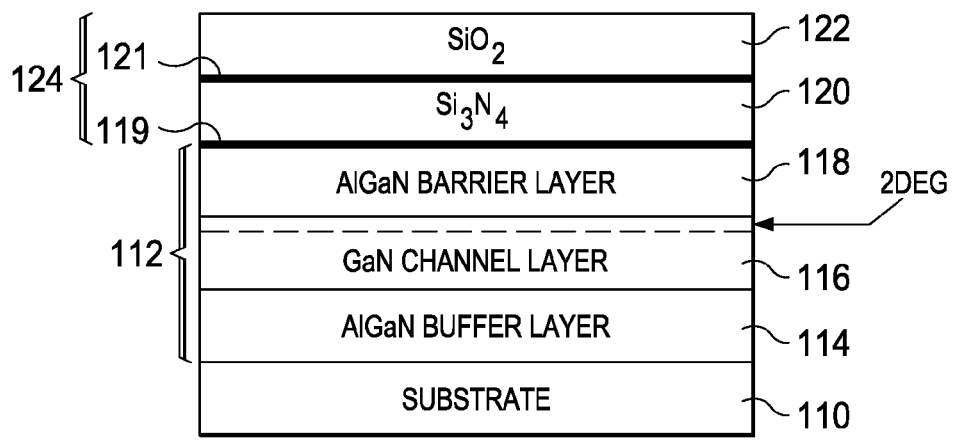

As shown in FIG. 3, after the $Si_3N_4$ layer 120 has been grown, part of the $Si_3N_4$ layer 120 is oxidized in a steam/wet rapid thermal oxidation process to form a $SiO_2$ layer 122 that lies on the remaining $Si_3N_4$ layer 120. In the present invention, the combination of the $Si_3N_4$ and $SiO_2$ layers form a gate insulation layer 124 of the transistor which has, for example, a $Si_3N_4$ layer that is 64 A thick and a $SiO_2$ layer that is 128 A thick. The oxidation of the $Si_3N_4$ layer 120 produces an upper transition layer 121 between the $Si_3N_4$ layer 120 and the $SiO_2$ layer 122 that also has a very low density of interfacial states.

Figure 4:
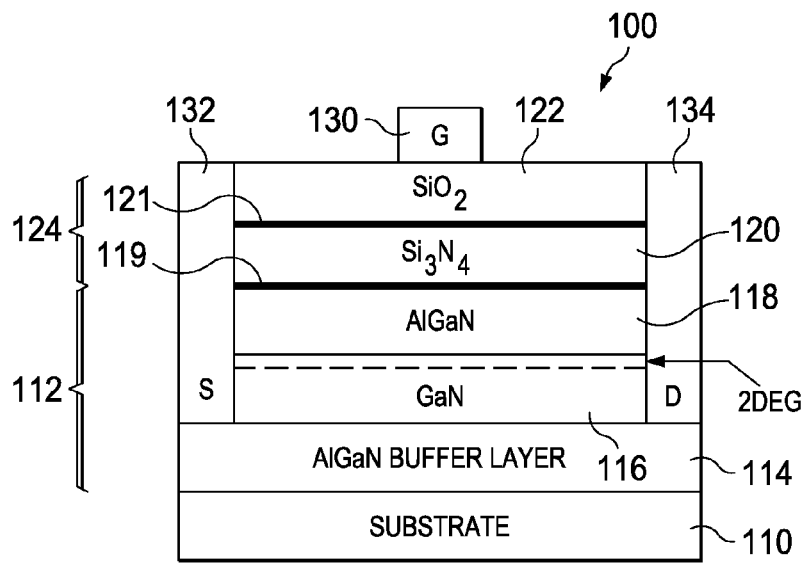

As shown in FIG. 4, following the formation of $SiO_2$ layer 122, the method completes the formation of GaN MOSFET 100 by forming a metal gate region 130, a metal source region 132, and a metal drain region 134 in a conventional fashion, e.g., using titanium aluminum contacts, followed by the conventional formation of an overlying passivation layer. The metal gate region 130 is formed to touch the $SiO_2$ layer 122 of gate insulation layer 124. The metal source 132 and metal drain regions 134 are formed to make an ohmic contact with the GaN channel layer 116 and the AlGaN barrier layer 118.

As noted above, the AlGaN of the barrier layer and the GaN of the channel layer have different band gaps, and are conventionally formed to induce a two-dimensional electron gas (2DEG) that lies at the junction between the AlGaN barrier layer and the GaN channel layer and extends down into the GaN channel layer.

As further noted above, the 2DEG, which functions as the "channel" of the transistor, produces a high concentration of electrons which causes a conventionally-formed GaN MOSFET to be a depletion mode device (nominally on when zero volts are applied to the gate of the device and the source and drain regions are differently biased).

Thus, to form GaN MOSFET 100 shown in FIG. 4 as an enhancement-mode device (nominally off when zero volts are applied to the metal gate region 130, and the metal source region 132 and the metal drain region 134 are differently biased), the AlGaN barrier layer 118 must be made thin enough (e.g., a few nm thick) so that when zero volts are applied to the metal gate region 130 (and the metal source region 132 and the metal drain region 134 are differently biased) substantially no electrons are present in the 2DEG region, and when a voltage that exceeds a threshold voltage is a applied to the metal gate region 130 (and the metal source region 132 and the metal drain region 134 are differently biased), electrons accumulate in the 2DEG region and flow from the metal source region 132 to the metal drain region 134.

Figure 5:
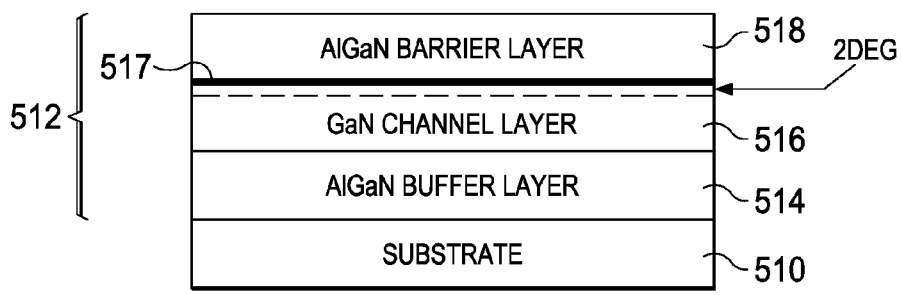
FIGS. 5-9 are a series of cross-sectional views illustrating an example of a method of forming an enhancement-mode GaN MOSFET 500 in accordance with an alternate embodiment of the present invention.

FIGS. 5-9 show a series of cross-sectional views that illustrate an example of a method of forming an enhancement-mode GaN MOSFET 500 in accordance with an alternate embodiment of the present invention. As shown in FIG. 5, the alternate method of the present invention also utilizes a conventionally-formed semiconductor substrate 510. As with substrate 110, substrate 510 can also be implemented as an insulating substrate or with a highly resistive material such as silicon (e.g., <111>), sapphire, or silicon carbide.

As further shown in FIG. 5, the alternate method of the present invention begins by forming an epitaxial layer 512 on substrate 510 in the same manner that epitaxial layer 112 was formed (in a MOCVD reactor using a conventional process). As a result, epitaxial layer 512 includes an undoped AlGaN buffer layer 514, an undoped GaN channel layer 516, and an undoped or n-doped AlGaN barrier layer 518 (or optionally an undoped or n-doped InAlGaN barrier layer 518). The AlGaN buffer layer 514, in turn, includes a number of undoped AlGaN layers with different aluminum compositions that are used to mitigate stress.

However, unlike GaN MOSFET 100, the AlGaN barrier layer 518 is formed to have a conventional (depletion-mode) thickness and, as a result, induces the formation of a two-dimensional electron gas (2DEG) that lies at the junction between the AlGaN barrier layer 518 and the GaN channel layer 516 and extends down into the GaN channel layer 516.

The 2DEG that lies at the junction between the AlGaN barrier layer 518 and the GaN channel layer 516 produces a high concentration of electrons.

Figure 6:
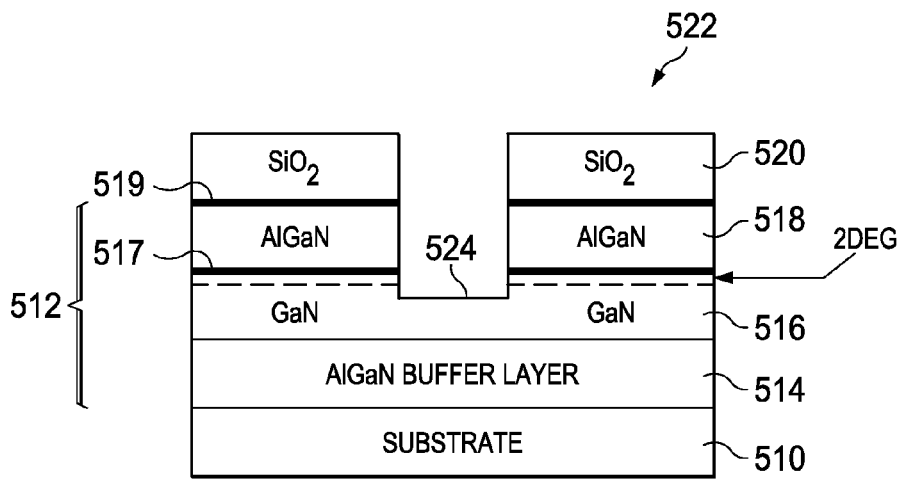

As shown in FIG. 6, in accordance with the present invention, after epitaxial layer 512 has been formed, a mask 520, such as a layer of $SiO_2$, is formed and patterned on the top surface of the AlGaN barrier layer 518. Once mask 520 has been formed, the regions exposed by the mask 520 are dry etched. The dry etch can stop above, at, or below a lowest level of the 2DEG that lies at the top surface of GaN channel layer 516. (FIG. 6 illustrates the dry etch stopping just below the lowest level of the 2DEG.)

As further shown in FIG. 6, the dry etch produces an intermediate MOSFET structure 522 that has an exposed region 524. Following the dry etch, the intermediate MOSFET structure 522 is next baked in $H_2$ and $NH_3$ in the MOCVD reactor to repair damage to the lattice that was caused by the dry etch. In other words, the intermediate MOSFET structure 522 is baked after the dry etch without removing the intermediate MOSFET structure 522 from the MOCVD reactor.

Figure 7:
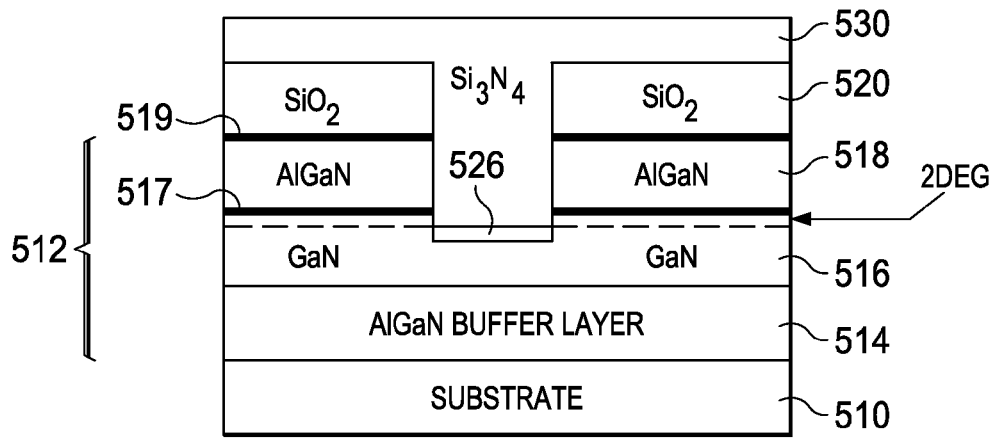

As shown in FIG. 7, after the intermediate MOSFET structure 522 has been baked, a thin undoped or n-doped AlGaN barrier film 526 (or optionally a thin undoped or n-doped InAlGaN barrier film 526) is epitaxially grown on the exposed region 524. A top surface of the thin AlGaN barrier film 526 can lie above, at, or below a lowest level of the 2DEG. (FIG. 7 illustrates the top surface of the AlGaN barrier film 526 lying at the lowest level of the 2DEG.) The thin AlGaN barrier film 526 has a thickness that is less than a largest thickness of the AlGaN barrier layer 518.

Once the thin AlGaN barrier film 526 has been grown, a $Si_3N_4$ layer 530 is epitaxially grown on the thin AlGaN barrier film 526 directly in the same MOCVD reactor as the thin AlGaN barrier film 526 using $SiH_4$ and $NH_3$. In other words, the $Si_3N_4$ layer 530 is epitaxially grown after the thin AlGaN barrier film 526 is grown without removing the structure with the thin AlGaN barrier film 526 from the MOCVD reactor. (As shown in FIG. 7, the $Si_3N_4$ layer 530 also grows on the side walls of the AlGaN barrier layer 518 and on the $SiO_2$ mask 520.)

The $Si_3N_4$ layer 530 is preferably grown to have a thickness of approximately 10-100 nm over the thin AlGaN film 526, with the specific thickness being application dependent. As before, the process produces a lower transition layer 529 between the $Si_3N_4$ layer 530 and the thin AlGaN barrier film 526 that has a very low density of interfacial states, e.g., expected to be less than $1 \times 10^{11}/cm^2$.

Figure 8:
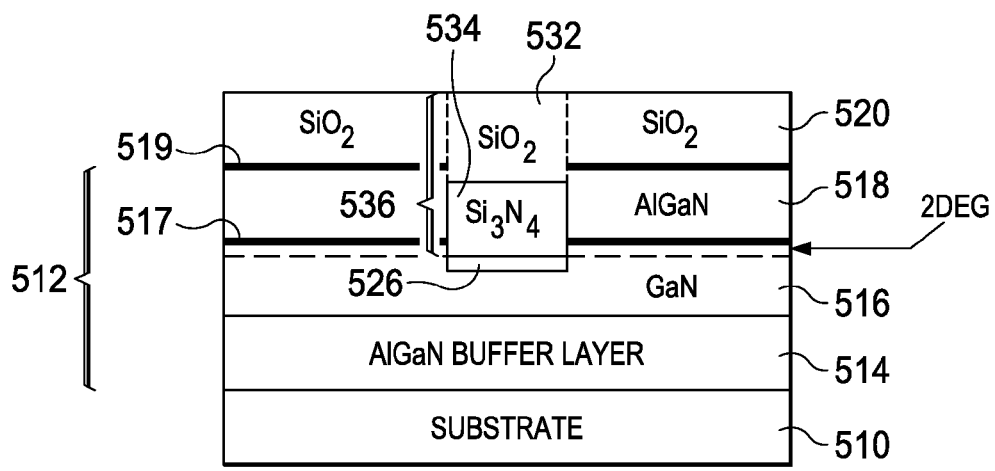

As shown in FIG. 8, following the growth of the $Si_3N_4$ layer 530, a part of the $Si_3N_4$ layer 530 is oxidized in a steam/wet rapid thermal oxidation process to form a $SiO_2$ region 532 that lies on a $Si_3N_4$ region 534 which, in turn, lies over the thin AlGaN barrier film 526. As further shown in FIG. 8, the AlGaN barrier layer 518 lies laterally adjacent to the $Si_3N_4$ region 534. (The oxidation process also oxidizes the $Si_3N_4$ layer 530 that lies over the $SiO_2$ mask 520, thereby increasing the thickness of the $SiO_2$ mask 520.)

In the present invention, the combination of the $Si_3N_4$ region 534 and the $SiO_2$ region 532 forms a gate insulation layer 536 that lies over the thin AlGaN film 526 which has, for example, a $Si_3N_4$ region that is 64 A thick and a $SiO_2$ region that is 128 A thick. As before, the oxidation of the $Si_3N_4$ layer 530 produces an upper transition layer 533 between the $Si_3N_4$ region 534 and the $SiO_2$ region 532 that also has a very low density of interfacial states.

Figure 9:
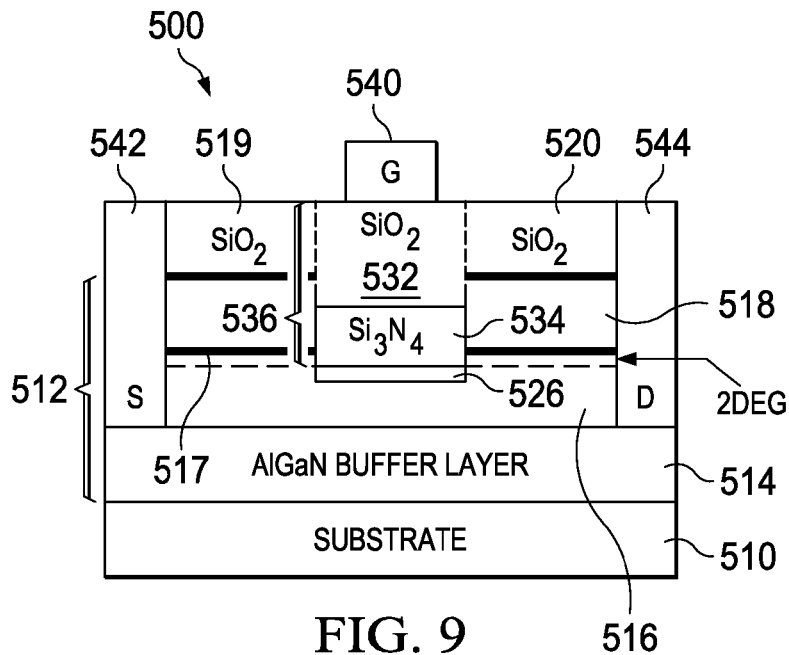

As shown in FIG. 9, following the formation of $SiO_2$ region 532, the method completes the formation of GaN MOSFET 500 by forming a metal gate region 540, a metal source region 542, and a metal drain region 544 in a conventional fashion, e.g., using titanium aluminum contacts, followed by the conventional formation of an overlying passivation layer. The metal gate region 540 is formed to touch SiO₂ region 532 of gate insulation layer 536. The metal source 542 and metal drain regions 544 are formed to make an ohmic contact with the GaN channel layer 516 and the AlGaN barrier layer 518.

Thus, GaN MOSFET 500 shown in FIG. 9 is formed as an enhancement-mode device (nominally off when zero volts are applied to the metal gate region 540 and the metal source region 542 and the metal drain region 544 are differently biased) by forming the AlGaN barrier film 526 to be thin enough (e.g., a few nm thick) so that when zero volts are applied to the metal gate region 540 (and the metal source region 542 and the metal drain region 544 are differently biased) substantially no electrons accumulate directly under the gate insulation layer 536 and the metal gate region 540, and when a voltage that exceeds a threshold voltage is a applied to metal gate region 540 (and the metal source region 542 and the metal drain region 544 are differently biased), electrons accumulate directly under the gate insulation layer 536 and the metal gate region 540 and flow from the metal source region 542 to the metal drain region 544.

One of the advantages of the present invention is that the $Si_3N_4$ portion of the $SiO_2/Si_3N_4$ gate insulation layer significantly reduces the formation of interface states at the junction between the gate insulation layer and the AlGaN barrier layer (or optional InAlGaN barrier layer). Significantly reducing the number of sites where electrons can be trapped significantly improves the long-term reliability of the GaN devices.

A further advantage of the present invention is that by utilizing $SiO_2$ as the capping layer of the $SiO_2/Si_3N_4$ gate insulation layer, the present invention has the lowest leakage current and a threshold voltage as high as 2.5 volts (i.e., $SiO_2$ has a bandgap Eg of 9 eV and a ΔEc to AlGaN that can be as high as 2.5 eV).

Figure 10:
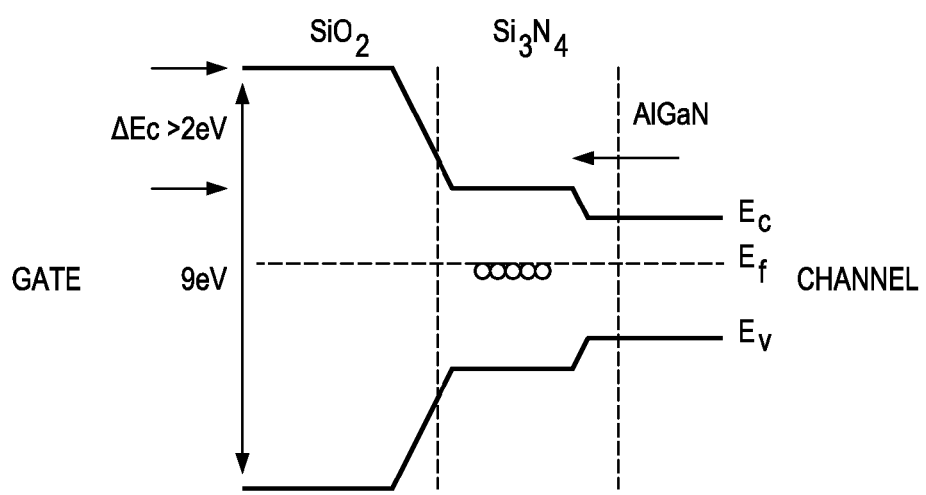
FIG. 10 is a band diagram illustrating the leakage current in accordance with the present invention.

FIG. 10 shows a band diagram that illustrates the leakage current in accordance with the present invention. As shown in FIG. 10, the band lineup shows that there is limited tunneling in the gate oxide due to the low density of interface states and the wide band gap of $SiO_2$. In addition, the effective ΔEc from $SiO_2$ to AlGaN is greater than 2 eV with a threshold voltage Vt that is greater than 2V.

It should be understood that the above descriptions are examples of the present invention, and that various alternatives of the invention described herein may be employed in practicing the invention. Therefore, it is intended that the following claims define the scope of the invention and that structures and methods within the scope of these claims and their equivalents be covered thereby.

What is claimed is:

1. An enhancement-mode transistor comprising:
   a channel layer including GaN;
   a barrier layer, the barrier layer including AlGaN touching the channel layer;
   a lower transition layer touching the barrier layer;
   a region of $Si_3N_4$, the region of $Si_3N_4$ touching the lower transition layer on the lower side of the $Si_3N_4$, wherein the $Si_3N_4$ layer and the barrier layer share anions to produce the lower transition layer;
   an upper transition layer touching the $Si_3N_4$ on the upper side of the $Si_3N_4$, the upper transition layer produced by an oxidation of the $Si_3N_4$;
   a region of $SiO_2$, the region of $SiO_2$ having a top surface, touching the, upper transition layer and lying over the region of $Si_3N_4$; and
   a metal gate, the metal gate having a bottom surface that touches the top surface of the region of $SiO_2$ in a horizontal plane, and being spaced apart from the region of $Si_3N_4$, no portion of the region of $SiO_2$ lying above the horizontal plane;
   a spaced-apart metal source region and metal drain region that touch the barrier layer,
   wherein the barrier layer including AlGaN is below a threshold of thickness such that when substantially zero volts are applied to the metal gate region, and the metal gate region and the metal drain region are differently biased, substantially no electrons comprise a two-dimensional electron gas region between the barrier layer including AlGaN and the channel layer including GaN; and
   when a voltage that exceeds a threshold voltage of the enhancement-mode transistor is applied to the metal gate region, and the metal source region and the metal gate region are differently biased, electrons accumulate in the two-dimensional electron gas region between the barrier layer including AlGaN and the channel layer including GaN, and the electrons flow from the metal source region to the metal drain region.

2. The enhancement-mode transistor of claim 1 wherein the barrier layer further includes indium.

3. The enhancement-mode transistor of claim 1 and further comprising a channel layer that touches and lies below the barrier layer, the channel layer including GaN.

4. The enhancement-mode transistor of claim 3 and further comprising a barrier film that touches and lies below the region of $Si_3N_4$, the barrier film having a thickness that is less than a largest thickness of the barrier layer, the barrier film including AlGaN.

5. The enhancement-mode transistor of claim 4 wherein the barrier layer lies laterally adjacent to the region of $Si_3N_4$.

6. The enhancement-mode transistor of claim 5 wherein the barrier layer further includes indium.

7. The enhancement-mode transistor of claim 1 wherein the region of $SiO_2$ has a substantially uniform thickness.

8. The enhancement-mode transistor of claim 1, wherein the lower transition layer between the $Si_3N4$ layer and the AlGaN barrier layer has a density of interfacial states less than substantially $1 \times 10^{11}/cm^2$.

9. An enhancement-mode transistor comprising:
   a channel layer including GaN;
   a barrier layer including InAlGaN touching the channel layer;
   a lower transition layer touching the barrier layer;
   a first non-conductive region that touches the lower transition layer on the lower side of the first non-conductive region, wherein the non-conductive region layer and the barrier layer share anions to produce the lower transition layer;
   an upper transition layer touching the $Si_3N_4$ on the upper side of the $Si_3N_4$ the upper transition layer produced by an oxidation of the $Si_3N_4$;
   a second non-conductive region that touches the upper transition layer and lies over the first non-conductive region, the second non-conductive region having a top surface; and
   a metal gate having a bottom surface that touches the top surface of the second non-conductive region in a horizontal plane, and being spaced apart from the first non-conductive region, no portion of the second non-conductive region lying above the horizontal plane;
   a metal source that touches the barrier layer, the metal source being spaced apart from the metal gate; and a metal drain that touches the barrier layer, the metal drain being spaced apart from the metal gate and the metal source, wherein
the barrier layer including InAlGaN is below a threshold of thickness such that when substantially zero volts are applied to the metal gate region, and the metal gate region and the metal drain region are differently biased, substantially no electrons comprise a two-dimensional electron gas region between the barrier layer including InAlGaN and the channel layer including GaN; and
when a voltage that exceeds a threshold voltage of the enhancement-mode transistor is applied to the metal gate region, and the metal source region and the metal gate region are differently biased, electrons accumulate in the two-dimensional electron gas region between the barrier layer including InAlGaN and the channel layer including GaN, and the electrons flow from the metal source region to the metal drain region.

10. The enhancement-mode transistor of claim 9 wherein:
the second non-conductive region has a substantially uniform thickness; and
the top surface of the second non-conductive region extends from the metal drain to the metal source, substantially all of the top surface of the second non-conductive region lying in the horizontal plane.

11. The enhancement-mode transistor of claim 9 wherein the barrier layer further includes aluminum.

12. The enhancement-mode transistor of claim 9 wherein the first non-conductive region includes silicon nitride, and the second non-conductive region includes silicon dioxide.

13. The enhancement-mode transistor of claim 9, wherein the lower transition layer between the $Si_3N_4$ layer and the InAlGaN barrier layer has a density of interfacial states less than substantially $1 \times 10^{11}/cm^2$.

14. an enhancement-mode transistor comprising:
a channel layer including GaN;
a barrier layer including AlGaN, the barrier layer having an opening;
a lower transition layer touching the barrier layer;
a metal source that touches the barrier layer;
a metal drain that touches the barrier layer, the metal drain being space apart from the metal source;
a first non-conductive region that lies in the opening and touches the lower transition layer on the lower side of the first non-conductive region, wherein the first non-conductive region and the barrier layer share anions to produce the lower transition layer, the first non-conductive region being spaced apart from the metal source and the metal drain;
an upper transition layer touching the first non-conductive region on the upper side of the first non-conductive region, the upper side transition layer produced by an oxidation of the first non-conductive region;
a second non-conductive region that touches the upper transition layer, the metal source, and the metal drain, the second non-conductive region lying over the first non-conductive region and having a top surface; and
a metal gate having a bottom surface that touches the top surface of the second non-conductive region, lying vertically over the opening, and being spaced apart from the metal source, the metal drain, and the first non-conductive region,
a metal source that touches the barrier layer, the metal source being spaced apart from the metal gate; and
a metal drain that touches the barrier layer, the metal drain being spaced apart from the metal gate and the metal source; wherein
the barrier layer including AlGaN is below a threshold of thickness such that when substantially zero volts are applied to the metal gate region, and the metal gate region and the metal drain region are differently biased, substantially no electrons comprise a two-dimensional electron gas region between the barrier layer including AlGaN and the channel layer including GaN; and
when a voltage that exceeds a threshold voltage of the enhancement-mode transistor is applied to the metal gate region, and the metal source region and the metal gate region are differently biased, electrons accumulate in the two-dimensional electron gas region between the barrier layer including AlGaN and the channel layer including GaN, and the electrons flow from the metal source region to the metal drain region.

15. The enhancement-mode transistor of claim 14 and further comprising a channel layer that touches and lies below the barrier layer, the channel layer and the barrier layer having different materials, the opening exposing the channel layer.

16. The enhancement-mode transistor of claim 15 wherein the first non-conductive region includes silicon nitride, and the second non-conductive region includes silicon dioxide.

17. The enhancement-mode transistor of claim 14 wherein the barrier layer further includes aluminum.

18. The enhancement-mode transistor of claim 17 wherein the barrier layer further includes indium.

19. The enhancement-mode transistor of claim 17 wherein the first non-conductive region includes silicon nitride, and the second non-conductive region includes silicon dioxide.

20. The enhancement-mode transistor of claim 14, wherein the lower transition layer between the $Si_3N_4$ layer and the InAlGaN barrier layer has a density of interfacial states less than substantially $1 \times 10^{11}/cm^2$.

* * * * *